United States Patent [19]

Neuhof et al.

[11] Patent Number: 6,050,738
[45] Date of Patent: Apr. 18, 2000

[54] DEVICE FOR FITTING A CONTROL PANEL TO THE LOWER FRONT EDGE OF A CONTROL DEVICE

[75] Inventors: Markus Neuhof, Ehringshausen-Niedelemp; Wolfgang Reuter, Burbach, both of Germany

[73] Assignee: Rittal-Werk Rudolf Loh GmbH, Herborn, Germany

[21] Appl. No.: 08/930,804

[22] PCT Filed: Jun. 5, 1996

[86] PCT No.: PCT/EP96/02757

§ 371 Date: Oct. 8, 1997

§ 102(e) Date: Oct. 8, 1997

[87] PCT Pub. No.: WO97/04379

PCT Pub. Date: Feb. 6, 1997

[30] Foreign Application Priority Data

Jul. 15, 1995 [DE] Germany ............................ 195 12 880

[51] Int. Cl.[7] ..................................................... G06F 1/16
[52] U.S. Cl. ........................... 403/205; 403/295; 403/382; 364/708.1
[58] Field of Search ................................. 403/205, 295, 403/296, 382, 403, DIG. 12, 401, 231; 312/7.2, 223.2; 348/836; 361/680, 681, 686, 724, 732, 733, 752; 364/708.1

[56] References Cited

U.S. PATENT DOCUMENTS 2,904,360 9/1959 Gamlen ........................................ 403/22
4,669,053 5/1987 Krenz ........................................ 364/708
4,730,364 3/1988 Tat-Kee ................................ 364/708.1 X
4,928,470 5/1990 Perez .................................... 403/295 X
5,011,323 4/1991 Liuo ...................................... 403/403 X
5,021,763 6/1991 Obear ................................. 364/708.1 X
5,340,073 8/1994 Masakazu ............................. 403/103 X
5,498,165 3/1996 Tseng ................................. 364/708.1 X
5,516,225 5/1996 Kvols .................................... 403/205 X
5,566,048 10/1996 Esterberg et al. ....................... 361/681
5,668,570 9/1997 Ditzik ................................ 364/708.1 X
5,695,263 12/1997 Simon et al. ........................ 403/205 X

FOREIGN PATENT DOCUMENTS 0 360 384   3/1990   European Pat. Off. .
2938197 A1  4/1981   Germany .
3910128 A1 10/1990   Germany .
   1267638 10/1986   Russian Federation ............... 403/375
   2212879  8/1989   United Kingdom .
WO 95/05631  2/1995   WIPO .

OTHER PUBLICATIONS

Rittal Handbuch 28, Cover page and pp. 180, 183 and 185 dated Nov. 10, 1994.

*Primary Examiner*—Lynne H. Browne
*Assistant Examiner*—David E. Bochna
*Attorney, Agent, or Firm*—Jansson, Shupe, Bridge & Munger, Ltd.

[57] ABSTRACT

The invention relates to a device for fitting a control panel to the lower front edge of a control device. To provide the connection there are specially shaped corner pieces provided with screw sleeves which are inserted into screw apertures in the frame and secured therein by screws.

9 Claims, 3 Drawing Sheets

DEVICE FOR FITTING A CONTROL PANEL TO THE LOWER FRONT EDGE OF A CONTROL DEVICE

FIELD OF THE INVENTION

This invention relates generally to an apparatus for connecting objects together and more particularly, to an apparatus for connecting a control panel to a control device.

BACKGROUND OF THE INVENTION

Today it is often desirable to connect a control device to a control panel in such a manner that the control panel is attached projecting outward in the area of the lower edge of the control device.

Apparatus is know in which the control device and the control panel are one structural unit and, therefore, can only be used together. Situations arise, however, where it would be useful to be able to separate the control device from the control panel in order to use the control panel with another control device or vice versa.

OBJECTS OF THE INVENTION

An object of the invention is to provide a new apparatus for connecting a control panel to a control device that overcomes some of the problems and shortcomings of the prior art.

Another object of the invention is to provide a new apparatus for connecting a control panel to a control device that allows a control panel and a control device to be connected to each other in a simple manner. How these and other important objects are accomplished will be apparent from the following descriptions and from the drawings.

SUMMARY OF THE INVENTION

The invention involves an apparatus for attaching a control panel to a control device. The apparatus is comprised of a control device having a first and second side and a control panel having an upper and lower side. A first frame that includes a screw receptacle surrounds the first side of the control device while a second frame also having a screw receptacle surrounds the upper side of the control panel. Two angled pieces, each having a first and second arm with a front and back side and at least one collet projecting from the front side of the first arm are inserted into the screw receptacle on the frame surrounding the control device. At least one collet projects from the front side of the second arm and is inserted into the screw receptacle on the frame surrounding the control panel. A plurality of fastening screws are then used to secure the first and second angled piece to the control device and the control panel.

In a particular embodiment of the invention, the frames surrounding both the control device and the control panel include corner connectors. In such embodiment, the first arms of the two angled pieces are connected to the corner connectors on the frame surrounding the control device and the second arms of the angled pieces are connected to the corner connectors on the frame surrounding the control panel. In a specific version of this embodiment, the frame surrounding the control device has a facing dimension. The first arm of the first angled piece extends along the facing dimension of the frame and the screw receptacles are inserted into the corner connectors on the frame.

In another embodiment of the invention, the first and second arms of the angled pieces form an angle greater than 90 degrees with respect to each other.

In still another embodiment of the invention, the angled piece has a transition section with a first and second end. The transition section is bent and an expanded screw head receptacle extends from each end of the transition section. In such embodiment, the first arm of the angled piece is connected to the first end of the transition section, the second arm is connected to the second end and the collets extend from the transition section through the expanded screw head receptacles.

In another embodiment of the invention, the frame surrounding the control device and the frame surrounding the control panel lie in a first and second plane respectively. In this embodiment, the screw receptacles for the collets of the first arm of the angled pieces are inserted into the corner connectors parallel to the first plane while the screw receptacles for the collets of the second arm are inserted into the corner connectors parallel to the second plane.

In a more preferred embodiment of the invention, the arms of the angled pieces have a hollow structure and the collets are fitted within the arms.

In still another preferred embodiment, the screw receptacles in the corner connectors have a receptacle section for the collets of the angled pieces and a threaded uptake for use with the fastening screws is connected to said receptacle section.

In yet another preferred embodiment, the fastening screws pass completely through a screw receptacle located in the arms of the angled pieces. Said fastening screws are then screwed into a screw channel located in the frames.

DETAILED DESCRIPTION OF THE INVENTION

Figure 1:
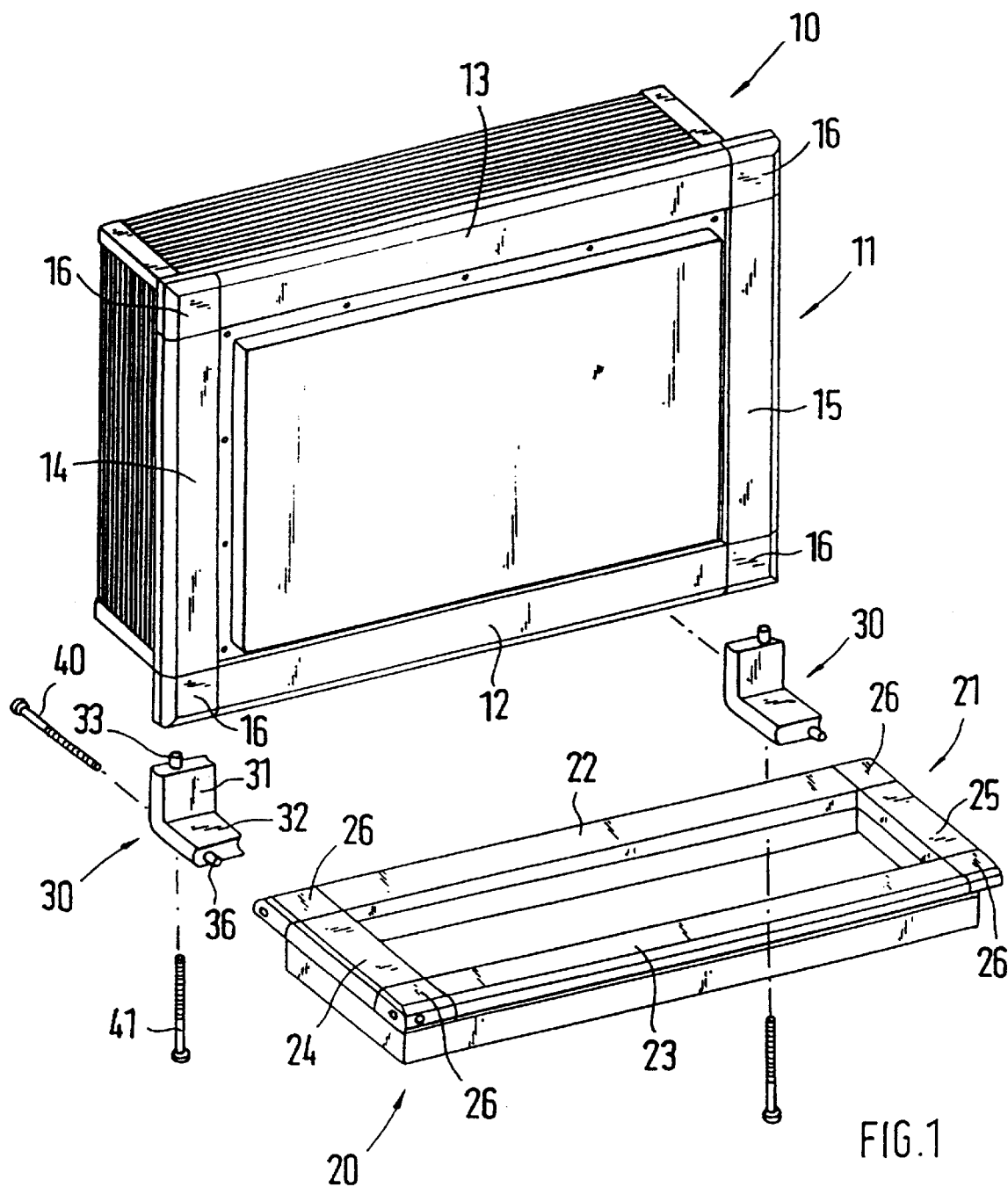
FIG. 1 is a perspective view of a control device and a control panel connected to each other by means of two angled pieces.

No details of the control device 10 and the control panel 20 are shown in FIG. 1. Instead, only those parts which are required for the arrangement according to the invention are described.

The front side of the control device 10 is surrounded by a frame 11 which is comprised of frame members 12, 13, 14 and 15 as well as corner connectors 16 on all of the corners. The remaining construction of the housing and the assembly of the parts on the front side are not of significance here. The same is true for the control panel 20, which is surrounded by a frame 21 comprised of corner connectors 26 and frame members 22, 23, 24 and 25.

In the exemplified embodiment two angled pieces 30 are provided for the attachment of the control panel 20 on the control device 10. The angled pieces connect the frame members 12 and 22 of the frame 11 and 12 to each other in the area of the corner connectors 16 and 26. The angled pieces 30 feature a width that corresponds to the facing dimension of the corner pieces 16 and 26. Collets 33 and 36 project at the free front face of the arms 31 and 32 of the angled pieces 30 and are inserted into the corresponding screw receptacles of the corner connectors 16 and 26 and are screwed to these by means of fastening screws 40 and 41 in order to obtain a tight connection between the control device 10 and the control panel 20. If the arms 31 and 32 of the angle piece 30 are at a right angle with respect to each other, then the control panel 20 is perpendicular to the front side of the control device 10, whereby the arm 31 determines the distance of both sides of the control panel 20 from the lower edge of the frame 11.

Figure 2:
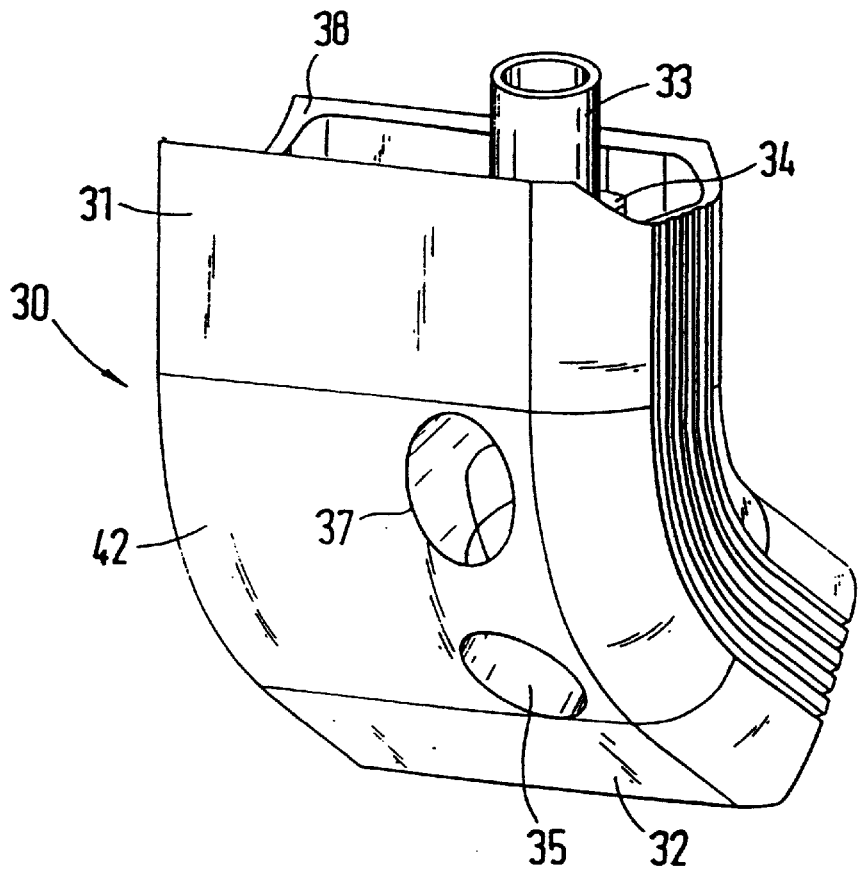
FIG. 2 is a perspective view showing an angled piece having a bent transition section between its first and second arms and a collet extending from one of the arms.
Figure 3:
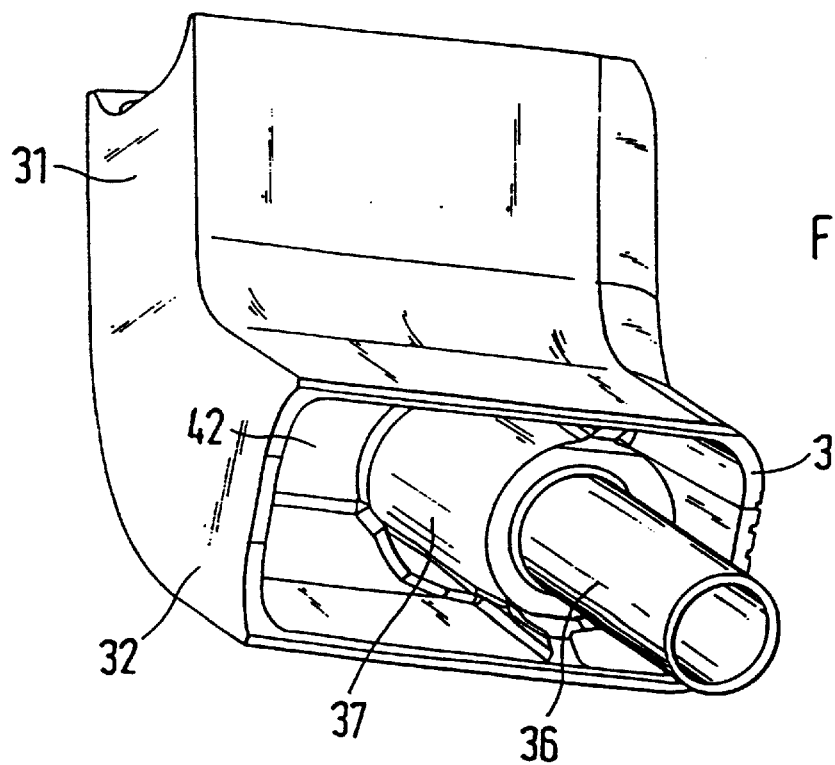
FIG. 3 is a perspective view of an angled piece having a bent transition section showing a front view of a collet extending from one of the arms.

FIGS. 2 and 3 show an angled piece 30 in enlarged scale, in a manner in which it can be utilized with the type of attachment as in FIG. 1. The arms 31 and 32 are essentially structurally hollow and are at an angle greater than 90 degrees with respect to each other as a result of the bent transition section 42, so that an inclined position of the control panel 20 can thus be achieved.

The collet 33 in the arm 32 transitions into another expanded screw head receptacle 34, in which the head of the fastening screw 41 is received and supported. 35 depicts the access to head receptacle 34 and collet 33. 37 depicts the access for fastening screw 40 to screw head receptacle 37 and to collet 36. The faces 38 and 39 of the arms 31 and 32 fit together with the outer contour of the corner connectors 16 and 26, so that a flush transition is always achieved.

The angled pieces 30 can be manufactured as injection molded parts composed of metal or plastic.

Figure 4:
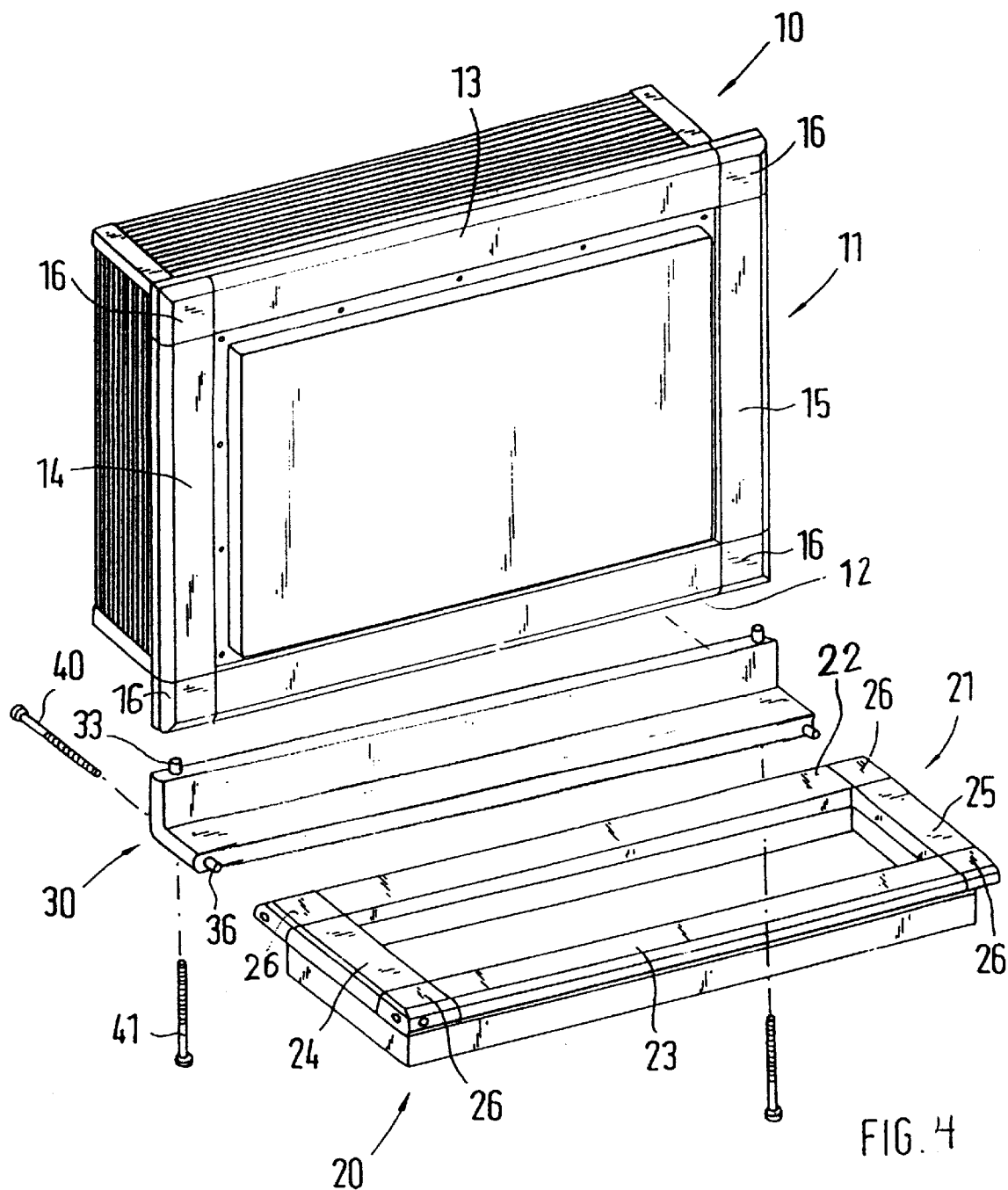
FIG. 4 is a perspective view of a control device and a control panel connected to each other by means of a single angled piece.

Instead of two angled pieces 30 connected only to the corner connectors 16 and 26, only a single, wide angled piece needs to be used to attach the control panel 20 to the control device 10, extending over the entire allocated frame dimension. This wide angled piece, as shown in FIG. 4, includes at least two collets 33 and 35, which provide the connection to both corner connectors 16 and 26 of the frame member 12 and 22 of the frame 11 and 21. In this way an entirely uninterrupted transition can be obtained between the control device 10 and the control panel 20.

The connection points can also be placed anywhere along the frame members 12 and 22. The positioning of the connection points in the area of the corner connectors 16 and 26, however, has the advantage that the frame member 12 to 15 and 22 to 26 can be formed as simple profile sections. A uniform profile can thereby be provided for the frames 11 and 21, and a uniform design for the corner connectors 16 and 26.

The connection between the control device 10 and the control panel 20 can also take place such that the frame members 12 to 15 of the frame 11 of the control device 10 and the frame member 22 to 25 of the frame 21 of the control panel 20 are connected to each other by means of corner connectors 16 or 26, so that the arms 31, 32 of the angled piece 30 feature screw receptacles for fastening screws 40, 41 that pass entirely through, and that the fastening screws 40, 41 can be screwed into screw channels of the frame members 14, 15 or 24, 25.

While the principles of this invention have been described in connection with specific embodiments, it should be understood clearly that these descriptions are made only by way of example and are not intended to limit the scope of the invention.

What is claimed is:

1. An apparatus for attaching a control panel to a control device comprised of:
   a control device having a first side and a second side;
   a control panel having an upper side and a lower side;
   a first frame surrounding the first side of the control device and having a screw receptacle;
   a second frame surrounding the upper side of the control panel and having a screw receptacle;
   a first angled piece and a second angled piece, each angled piece having a first arm and a second arm and each arm having a front side and a back side;
   at least one collet projecting from the front side of the first arm inserted into the screw receptacle on the frame surrounding the control device;
   at least one collet projecting from the front side of the second arm inserted into the screw receptacle on the frame surrounding the control panel; and
   a plurality of fastening screws securing the first and second angled pieces to the control device and to the control panel.

2. The apparatus of claim 1 wherein:
   the frame surrounding the control device includes corner connectors;
   the frame surrounding the control panel includes corner connectors;
   the first arms of the first and second angled pieces are connected to the corner connectors on the frame surrounding the control device; and
   the second arms of the first and second angled pieces are connected to the corner connectors on the frame surrounding the control panel.

3. The apparatus of claim 1 wherein the first and second arms of the angled pieces form an angle greater than 90 degrees with respect to each other.

4. The apparatus of claim 1 wherein
   the arms of the angled pieces each have a screw receptacle;
   the fastening screws pass extending through the screw receptacles; and
   the fastening screws are screwed into a screw channel located in the frames.

5. An apparatus for attaching a control panel to a control device comprised of:
   a control device having a first side and a second side;
   a control panel having an upper side and a lower side;
   a first frame surrounding the first side of the control device and having a screw receptacle;
   a second frame surrounding the upper side of the control panel and having a screw receptacle;
   a first angled piece and a second angled piece, each angled piece having a first arm and a second arm and each arm having a front side and a back side;
   at least one collet projecting from the front side of the first arm inserted into the screw receptacle on the frame surrounding the control device;
   at least one collet projecting from the front side of the second arm inserted into the screw receptacle on the frame surrounding the control panel; and
   a plurality of fastening screws securing the first and second angled pieces to the control device and to the control panel;
   wherein:
   the frame surrounding the control device includes corner connectors;
   the frame surrounding the control panel includes corner connectors;
   the first arms of the first and second angled pieces are connected to the corner connectors on the frame surrounding the control device; and the second arms of the first and second angled pieces are connected to the corner connectors on the frame surrounding the control panel;

and wherein:

the frame surrounding the control device has a facing dimension;

the first arm of the first angled piece extends along the facing dimension of the frame; and the screw receptacles are inserted into the corner connectors on the frame.

6. An apparatus for attaching a control panel to a control device comprised of:

a control device having a first side and a second side;

a control panel having an upper side and a lower side;

a first frame surrounding the first side of the control device and having a screw receptacle;

a second frame surrounding the upper side of the control panel and having a screw receptacle;

a first angled piece and a second angled piece, each angled piece having a first arm and a second arm and each arm having a front side and a back side;

at least one collet projecting from the front side of the first arm inserted into the screw receptacle on the frame surrounding the control device;

at least one collet projecting from the front side of the second arm inserted into the screw receptacle on the frame surrounding the control panel; and a plurality of fastening screws securing the first and second angled pieces to the control device and to the control panel;

wherein:

the angled piece has a transition section having a first and second end;

the transition section is bent;

an expanded screw head receptacle extends from each end of the transition section;

the first arm of the angled piece is connected to the first end of the transition section;

the second arm of the angled piece is connected to the second end of the transition section; and the collets extend from the transition section through the expanded screw head receptacles.

7. An apparatus for attaching a control panel to a control device comprised of:

a control device having a first side and a second side;

a control panel having an upper side and a lower side;

a first frame surrounding the first side of the control device and having a screw receptacle;

a second frame surrounding the upper side of the control panel and having a screw receptacle;

a first angled piece and a second angled piece, each angled piece having a first arm and a second arm and each arm having a front side and a back side;

at least one collet projecting from the front side of the first arm inserted into the screw receptacle on the frame surrounding the control device;

at least one collet projecting from the front side of the second arm inserted into the screw receptacle on the frame surrounding the control panel; and a plurality of fastening screws securing the first and second angled pieces to the control device and to the control panel;

wherein:

the frame surrounding the control device includes corner connectors;

the frame surrounding the control panel includes corner connectors;

the first arms of the first and second angled pieces are connected to the corner connectors on the frame surrounding the control device; and the second arms of the first and second angled pieces are connected to the corner connectors on the frame surrounding the control panel;

and wherein:

the frame surrounding the control device lies in a first plane;

the frame surrounding the control panel lies in a second plane;

the screw receptacles for the collets of the first arm of the angled pieces are inserted into the corner connectors parallel to the first plane; and the screw receptacles for the collets of the second arm of the angled pieces are inserted into the corner connectors parallel to the second plane.

8. An apparatus for attaching a control panel to a control device comprised of:

a control device having a first side and a second side;

a control panel having an upper side and a lower side;

a first frame surrounding the first side of the control device and having a screw receptacle;

a second frame surrounding the upper side of the control panel and having a screw receptacle;

a first angled piece and a second angled piece, each angled piece having a first arm and a second arm and each arm having a front side and a back side;

at least one collet projecting from the front side of the first arm inserted into the screw receptacle on the frame surrounding the control device;

at least one collet projecting from the front side of the second arm inserted into the screw receptacle on the frame surrounding the control panel; and a plurality of fastening screws securing the first and second angled pieces to the control device and to the control panel;

wherein:

the arms of the angled pieces have a hollow structure; and the collets are fitted within the arms.

9. An apparatus for attaching a control panel to a control device comprised of:

a control device having a first side and a second side;

a control panel having an upper side and a lower side;

a first frame surrounding the first side of the control device and having a screw receptacle;

a second frame surrounding the upper side of the control panel and having a screw receptacle;

a first angled piece and a second angled piece, each angled piece having a first arm and a second arm and each arm having a front side and a back side;

at least one collet projecting from the front side of the first arm inserted into the screw receptacle on the frame surrounding the control device;

at least one collet projecting from the front side of the second arm inserted into the screw receptacle on the frame surrounding the control panel; and a plurality of fastening screws securing the first and second angled pieces to the control device and to the control panel;

wherein:

the frame surrounding the control device includes corner connectors;

the frame surrounding the control panel includes corner connectors;

the first arms of the first and second angled pieces are connected to the corner connectors on the frame surrounding the control device; and the second arms of the first and second angled pieces are connected to the corner connectors on the frame surrounding the control panel;

and wherein:

receptacles in the corner connectors having a receptacle section for the collets of the angled pieces, to which a threaded uptake is connected for the fastening screws.

* * * * *